United States Patent
Braithwaite et al.

[11] Patent Number: 5,815,455
[45] Date of Patent: Sep. 29, 1998

[54] POWER SUPPLY INTERFACE CIRCUIT PROVIDING NONVOLATILE STORAGE WITH SUITABLE OPERATING AND STANDBY VOLTAGE LEVELS

[75] Inventors: Keith Andre Braithwaite; Gary Dale Carpenter, both of Pflugerville; Binh Thai Hoang, Round Rock; Cuong Thanh Nguyen, Austin; Howard Carl Tanner, Austin; Gary Yuh Tsao, Austin, all of Tex.

[73] Assignee: International Business Machines Corporation, Armonk, N.Y.

[21] Appl. No.: 933,701

[22] Filed: Sep. 19, 1997

[51] Int. Cl.$^6$ ................................................. G11C 13/00
[52] U.S. Cl. .......................................... 365/229; 365/226
[58] Field of Search .................................. 365/226, 227, 365/228, 229

[56] References Cited

U.S. PATENT DOCUMENTS

| | | |
|---|---|---|
| 4,800,533 | 1/1989 | Arakawa . |
| 4,908,790 | 3/1990 | Little et al. ............................. 365/229 |
| 4,965,828 | 10/1990 | Ergott, Jr. et al. . |
| 5,121,359 | 6/1992 | Steele . |
| 5,267,211 | 11/1993 | Kobayashi et al. . |
| 5,306,961 | 4/1994 | Leo . |
| 5,315,549 | 5/1994 | Scherpenberg et al. . |
| 5,373,478 | 12/1994 | Komatsu et al. . |
| 5,384,747 | 1/1995 | Clohset . |
| 5,502,682 | 3/1996 | Yoshimura . |
| 5,532,676 | 7/1996 | Moore, III . |
| 5,537,360 | 7/1996 | Jones et al. . |
| 5,563,839 | 10/1996 | Herdt et al. . |
| 5,581,507 | 12/1996 | Scherpenberg et al. . |
| 5,604,709 | 2/1997 | Price . |

Primary Examiner—Terrell W. Fears
Attorney, Agent, or Firm—Casimer K. Salys

[57] ABSTRACT

A power supply interface suitable to provide voltages of appropriate magnitude to a static random access memory (SRAM) device from a combination of independent sources including a main power supply, an auxiliary power supply, and a battery. The voltages from the interface are at levels consistent with the SRAM modes of operation. During limited voltage tolerance read and write access operations, main power supply voltage is provided through a low forward voltage drop switched metal oxide field effect transistor (MOSFET). Parasitic paths, potentially producible by the transistor and affecting the battery source of power, are eliminated through the use of a second, complementary MOSFET. The second MOSFET is directly responsive to a POWERGOOD signal from the main power supply, indicating both an "on" state and an appropriate voltage level of the main power supply.

14 Claims, 3 Drawing Sheets

POWER SUPPLY INTERFACE CIRCUIT PROVIDING NONVOLATILE STORAGE WITH SUITABLE OPERATING AND STANDBY VOLTAGE LEVELS

FIELD OF THE INVENTION

The invention relates generally to electrical power supply operation. More particularly, the invention is directed to an interface for providing reliable uninterrupted power to a semiconductor memory device.

BACKGROUND OF THE INVENTION

The use of static random access memory devices (SRAMs) to store data in personal computers and workstations over extended periods of time is well recognized in the industry. An example is described in U.S. Pat. No. 5,604,709, the subject matter of which is incorporated herein by reference. The key to storing data over extended periods and under different operating conditions involves the provision of electrical power to the SRAM device of a magnitude consistent with the specifications under the various operational conditions and without interruption.

There are three general states of power supply operation which on SRAM encounters in routine personal computer or workstation usage. The first is where the complete data processing system is electrically energized and operable under the main power supply. In that state, the electrical voltage provided to the SRAM ensures not only retention of the data entered into the SRAM, but is of a magnitude consistent with reading and writing accesses of the SRAM. For a conventional SRAM, the permissible power supply voltage tolerance is typically 10 percent for that state, for example, 5 volts plus or minus 0.5 volts. Though extended range SRAM devices are available, they are materially more expensive.

The second state of power supply operation experienced by the SRAM occurs when the main power supply of the data processing system is retained by power provided from an auxiliary power supply, nominally of the same +5 volts but of lesser power output capability. The auxiliary power supply energizes the SRAM when the main power supply is off and the data processing system is plugged into an active AC outlet. Since the SRAM is not being accessed, the ±10% supply voltage restriction is not applicable, but rather, is replaced by a nominal +2 volt minimum limit imposed for data retention.

The third state of SRAM power supply operation occurs when the AC power is completely absent, as might occur with a power loss or disconnection of the data processing system AC power plug. In that state, the SRAM is in the data retention mode with the earlier noted nominal +2 volt minimum supply requirement. Power in this state is furnished by a small battery.

A combination power supply is described in the aforementioned U.S. Pat. No. 5,604,709 as providing suitable voltage over the three power supply states. The principle problem which the present invention addresses arises when the +5 volt main power supply is coupled through a diode interface to the SRAM, introducing a voltage drop at or beyond the supply voltage tolerance limits permitted for accessing, reading and writing, the SRAM. For example, a conventional silicon diode between the SRAMs and the +5 volt supply would introduce a drop greater than the 0.5 volt tolerance allowed by the SRAM. Even specialized diodes consume substantially the full SRAM tolerance, allowing for no power supply accuracy, loading or aging effects.

In contrast to the 10% tolerance for the supply voltage during SRAM accessing operations, data retention requires +2 volts. The auxiliary power supply and battery are fully suited to meet that requirement even in the presence of respective diode drops. However, neither provides the voltage or current capability adequate to operate the SRAM in a reading or writing access mode.

What is needed is a power supply interface which accepts the different sources of power within their respective tolerances and provides a voltage to the SRAM suitable for both accessing and long term retention modes of operation without mandating specialized SRAM designs.

SUMMARY OF THE INVENTION

The invention provides reliable source of supply voltage within operational tolerances to a static random access memory through a power supply interface circuit, the circuit comprising, a first input line connected to a battery of first voltage, a second input line connected to an auxiliary supply of second voltage, the second voltage being greater than the first voltage, a third input line connected to a main power supply of third voltage, the third voltage being nominally equal to or greater than the second voltage, an output line connected to a nonvolatile storage device, diode interfaces between the output line and the first input line and the second input line, and a field effect transistor operable to selectively connect the output line to the third input line responsive to a main power supply power good signal.

In an extended composite, the invention encompasses a data processing system with nonvolatile memory and multiple sources of power for operating the nonvoltage memory, comprising, a computer system operable from a high output AC/DC converting main power supply, a low output AC/DC converting auxiliary power supply operable to sustain the data in the nonvolatile memory, a battery operable to sustain the data and the nonvolatile memory, diode means for interconnecting the auxiliary power supply and the battery to reliably power the nonvolatile memory, and field effect transistor means connected between the main power supply and the nonvolatile memory, operable in response to the state of a main power supply power good signal.

In a particularized form of the invention, power is supplied to a static random access memory within the operational tolerances under the standby conditions through respective diodes connecting a battery, for those circumstances which all power is disconnected, and an auxiliary 5 volt supply, for those circumstances when the main power of the data processing system is turned off. During SRAM accessing operations power is supplied from the main power supply through a switched metal oxide field effect transistor (MOSFET) to provide a supply voltage at the random access memory that is within the operating mode tolerance. The MOSFET is switched responsive to a power good signal from the system in an arrangement that avoids parasitic paths during the standby mode when the static random access memory is powered solely by the battery. This avoids undue drain on the battery to prolong battery life.

These and other features of the invention will be more clearly understood and appreciated upon considering the detailed embodiments described hereinafter.

DETAILED DESCRIPTION OF THE PREFERRED EMBODIMENT

Figure 1:
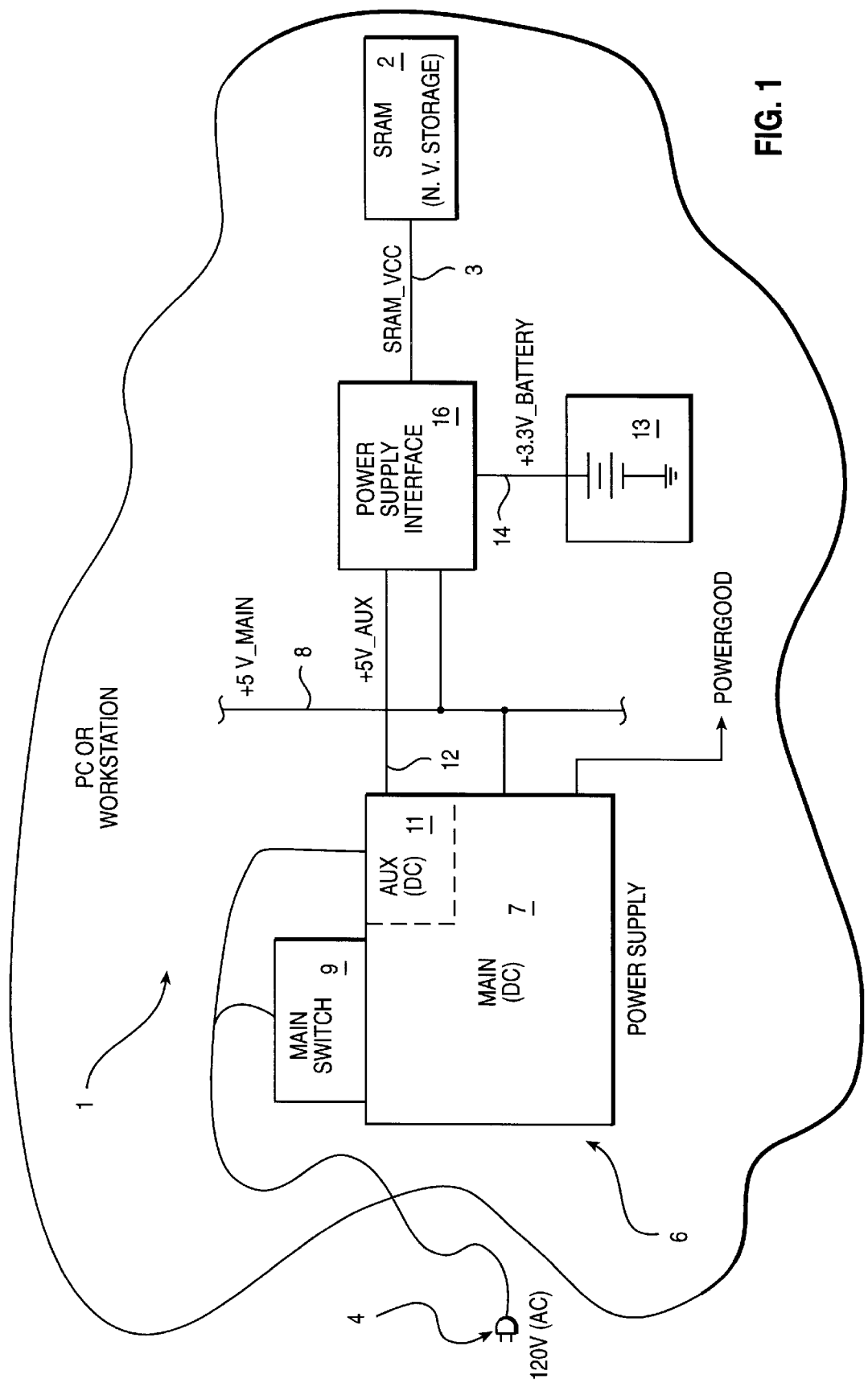
FIG. 1 schematically depicts by blocks the functional elements of the power supply within a representative personal computer or workstation.

FIG. 1 schematically depicts by block diagram the power supply section of a personal computer or workstation, generally at 1, as may be used to provide continuous voltage to a static random access memory (SRAM) nonvolatile data storage device. The power to SRAM 2 over line 3 must be uninterrupted if the data stored in SRAM 2 is to remain intact. Another constraint is that the SRAM_VCC voltage supplied on line 3 must remain within the operational constraints of SRAM 2, as described hereinbefore, wherein the voltage must be 5 volts ±0.5 volts during reading or writing accesses of SRAM 2 and be >2 volts for non-access data retention.

As depicted in FIG. 1, the PC or workstation is supplied with 120 volts AC, generally at 4, which is interruptable by the removal of the plug or cessation of the AC voltage. Within power supply system 1 of the PC or workstation, the 120 volts AC is converted to DC in the power supply, generally at 6, with main DC power supply 7 providing power to the whole PC or workstation at the level +5V_MAIN on line 8. Main power supply 7 is user-enabled through a switch, such as main switch 9.

Power supply 6 also includes an auxiliary DC power supply section identified by reference numeral 11, which is not switched but is consistently energized from 120 volt AC source 4. Auxiliary DC power supply 11 provides a voltage +5V_AUX of relatively small power capacity on line 12. The primary purpose of auxiliary DC power supply 11 is to sustain the data in SRAM 2 during those periods when main switch 9 is "off" while the PC or workstation remains connected to the active 120 volt AC line. Lastly, the PC or workstation system power supply 1 includes a 3.3 volt battery 13, providing on line 14 a voltage +3.3V_BATTERY.

The power supply interface to which the present invention is specifically directed appears as block 16, receives inputs +5V_MAIN, +5_AUX, and +3.3V_BATTERY over respective lines 8, 12, and 14 and provides an output SRAM_VCC on line 3 to SRAM 2. An embodiment of power supply interface 16 is shown in FIG. 2.

Figure 2:
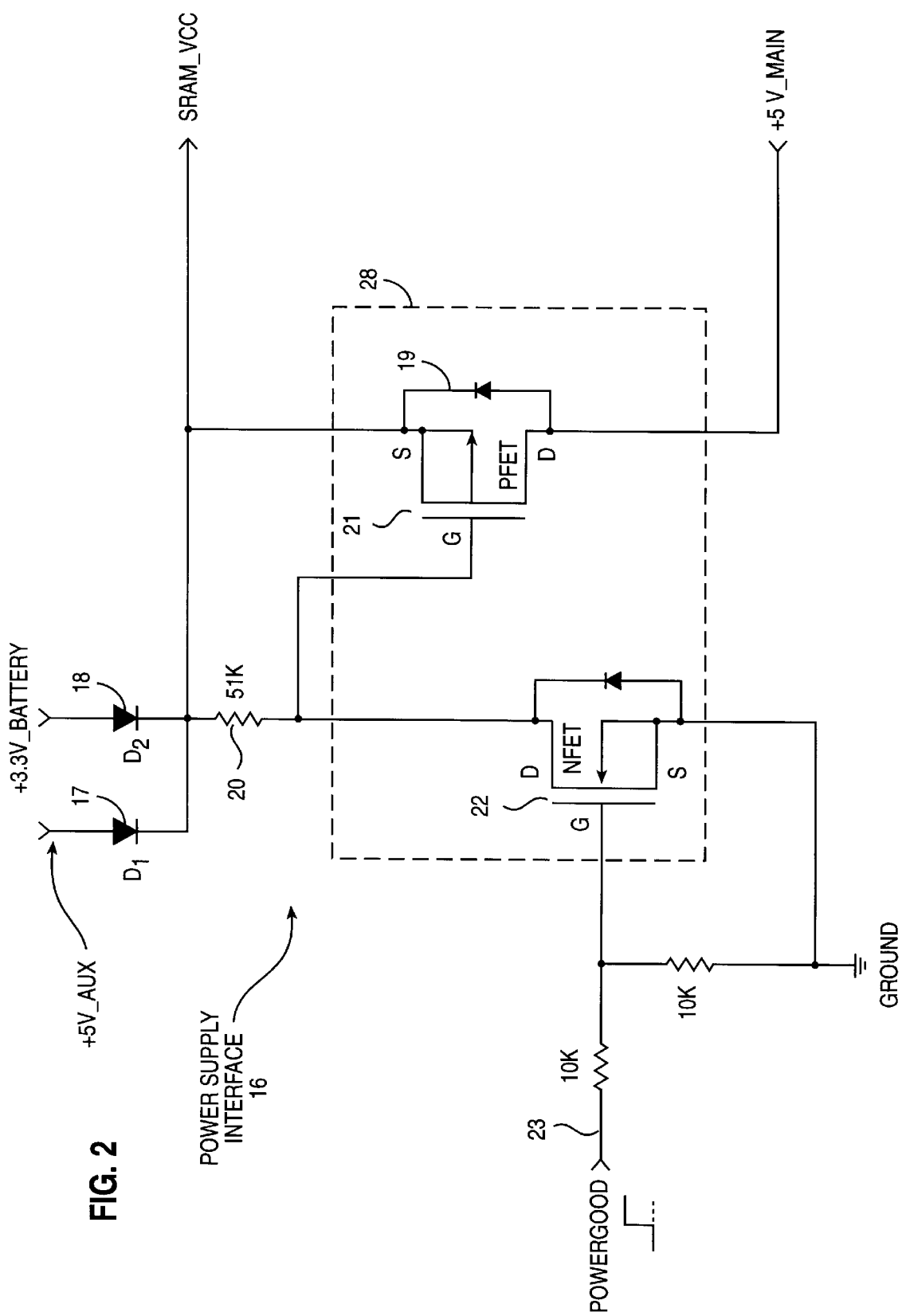
FIG. 2 schematically depicts an electronic circuit embodiment of the power supply interface.

Power supply interface 16 as particularized in FIG. 2 connects input voltages +5V_AUX and +3.3V_BATTERY to output voltage SRAM_VCC through OR logic configured diodes 17 and 18. Either input supplies the +2 volt minimum required for non-access operation of SRAM 2. However, the +5V_MAIN voltage is connected through to voltage SRAM_VCC using p-channel metal oxide field effect transistor (MOSFET) 21. MOSFET 21 operates as a switch, exhibiting a forward drop of 0.1 volts or less at the access mode operating current required by SRAM 2. In this way, the ±0.5 volt SRAM 2 access mode voltage tolerance on line SRAM_VCC is satisfied directly from the +5 volt main DC power supply.

MOSFET 21 is connected in FIG. 2 with the drain electrode common to the main power supply voltage +5V_MAIN to ensure that intrinsic diode 19 is appropriately directed. Note that intrinsic diode 19 provides a shunting path to MOSFET 21, though such diode path less than ideal given the overly high forward voltage drop inherent in the silicon junction which forms the diode.

N-channel MOSFET 22 is connected to selectively enable and disable MOSFET 21 by switching the voltage on the gate electrode of MOSFET 21 between ground and SRAM_VCC through interaction with pulled-up resistor 20. Note that when MOSFET 22 is disabled, so too is MOSFET 21, inhibiting all parasitic paths from line SRAM_VCC to either ground or +5V_MAIN. This avoids all inadvertent loads that might deplete battery 13. Clearly, premature depletion of battery 13 negates the very contribution sought from SRAM 2.

As embodied in FIG. 2, MOSFET 22 is selectively enabled by the signal POWERGOOD on line 23, which signal originates in main power supply 7 to indication that the +5V_MAIN voltage is both enabled and of appropriate magnitude. The use of the POWERGOOD signal ensures that MOSFET 21 is not enabled at a time when the main power supply voltage has yet to reach the +5 volt level, in that under that condition battery 13 could be depleted through the path defined by diode 18 and MOSFET 21.

Figure 3:
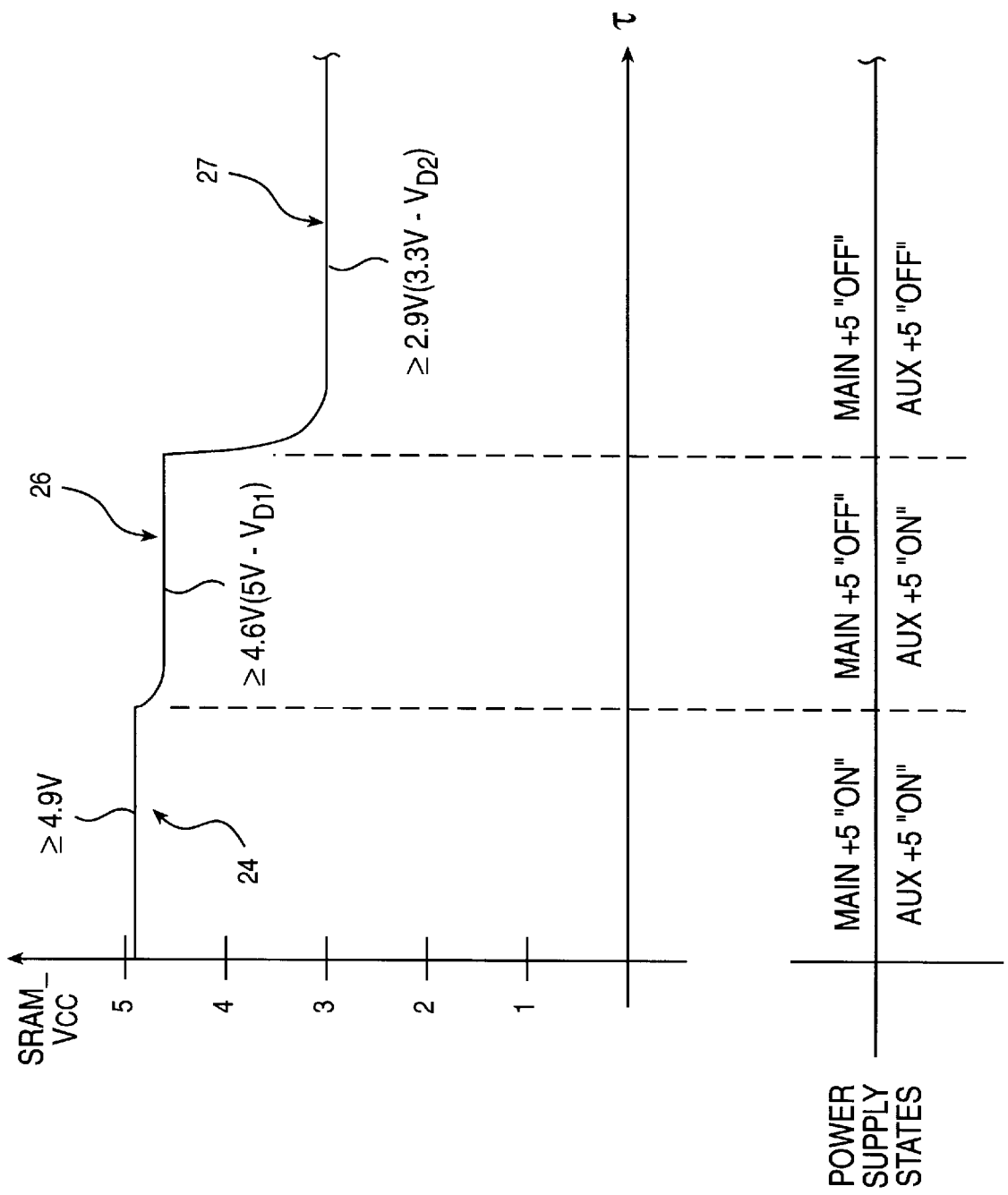
FIG. 3 schematically illustrates the three levels of voltage at the SRAM depending on the power supply states.

FIG. 3 schematically depicts the voltage SRAM_VCC for 3 operating states. As shown at 24, SRAM 2 receives at least 4.9 volts when main AC/DC power supply 7 is "on" and auxiliary AC/DC supply 11 is "on". The voltage drops to approximately 4.6 volts for a Schottky implementation of diode 17, or even less for a conventional silicon diode, when the main AC/DC power supply "off" and the auxiliary AC/DC power supply is "on". This is shown by the plot at 26. The plot at 27 depicts the voltage level when both main AC/DC power supply 7 and auxiliary AC/DC power supply 11 are in an "off" state, such as might occur with a disconnection of the PC or workstation from the AC power, or a loss of AC power. In this situation and with a Schottky type diode 18, the voltage SRAM_VCC is in the range of 2.9 volts. Recall that data retention mode of operation for SRAM 2 required a minimum of 2 volts.

An examination of the circuit in FIG. 2 for other transitions and states confirms that the voltage levels are satisfied, and foremost, there is no operating condition, transient or continuous, under which battery 13 is subjected to a load other than SRAM 2.

The implementation of power supply interface 16 using a pair of complementary MOSFETs 21 and 22, is readily accomplished using commercially available devices in efficiently packaged forms. For example, a pair of MOSFETs in a single integrated package 28 are available from Siliconix under the part number Si9942DY.

It will be understood by those skilled in the art that the embodiments set forth hereinbefore are merely exemplary of the numerous arrangements by which the invention may be practiced, and as such may be replaced by equivalence without departing from the invention which will now be defined by appended claims.

We claim:

1. A power supply interface circuit, comprising:
  a first input line connected to a battery of first voltage;
  a second input line connected to an auxiliary supply of second voltage, the second voltage being greater than the first voltage;
  a third input line connected to a main power supply of third voltage, the third voltage being nominally equal to or greater than the second voltage;
  an output line connected to a nonvolatile storage device;
  diode interfaces between the output line and the first input line and the second input line; and
  a field effect transistor operable to selectively connect the output line to the third input line responsive to a main power supply power good signal.

2. The apparatus recited in claim 1, wherein the diodes are connected in an OR logic format.

3. The apparatus recited in claim 2, wherein the nonvolatile storage device is a static random access memory.

4. The apparatus recited in claim 1, wherein the field effect transistor is a first channel type MOSFET with an intrinsic diode connecting the output line to the third input line, and the apparatus further comprises:

a second channel type transistor, driving the first channel type transistor responsive to the power good signal.

5. The apparatus recited in claim 2, wherein the field effect transistor is a first channel type MOSFET with an intrinsic diode connecting the output line to the third input line, and the apparatus further comprises:

a second channel type transistor, driving the first channel type transistor responsive to the power good signal.

6. The apparatus recited in claim 3, wherein the field effect transistor is a first channel type MOSFET with an intrinsic diode connecting the output line to the third input line, and the apparatus further comprises:

a second channel type transistor, driving the first channel type transistor responsive to the power good signal.

7. The apparatus recited in claim 4, wherein the first channel type transistor is a p-channel device and the second channel type transistor is an n-channel device.

8. The apparatus recited in claim 5, wherein the first channel type transistor is a p-channel device and the second channel type transistor is an n-channel device.

9. The apparatus recited in claim 6, wherein the first channel type transistor is a p-channel device and the second channel type transistor is an n-channel device.

10. A data processing system with nonvolatile memory and multiple sources of power for operating the nonvolatile memory, comprising:

a computer system operable from a high output AC/DC converting main power supply;

a low output AC/DC converting auxiliary power supply operable to sustain the data in the nonvolatile memory;

a battery operable to sustain the data in the nonvolatile memory;

diode means for interconnecting the auxiliary power supply and the battery to reliably power the nonvolatile memory; and field effect transistor means connected between the main power supply and the nonvolatile memory, operable in response to the state of a main power supply power good signal.

11. The apparatus recited in claim 10, wherein the field effect transistor means comprises a pair of field effect transistors, the first field effect transistor operable to selectively connect the main power supply to nonvolatile memory for accessing and the second field effect transistor switching responsive to the main power supply state signal.

12. The apparatus recited in claim 11, wherein the diode means comprises diodes connected in OR logic format.

13. The apparatus recited in claim 12, wherein the nonvolatile memory is static random access memory.

14. The apparatus recited in claim 13, wherein the first field effect transistor is a p-channel MOSFET device having an intrinsic diode which connects to the diodes in the OR logic format.

\* \* \* \* \*